United States Patent
Rölle et al.

(10) Patent No.: US 9,366,957 B2
(45) Date of Patent: *Jun. 14, 2016

(54) PHOTOPOLYMER FORMULATION HAVING TRIAZINE-BASED WRITING MONOMERS

(75) Inventors: Thomas Rölle, Leverkusen (DE); Friedrich-Karl Bruder, Krefeld (DE); Thomas Fäcke, Leverkusen (DE); Marc-Stephan Weiser, Leverkusen (DE); Dennis Hönel, Zülpich (DE)

(73) Assignee: Covestro Deutschland AG, Leverkusen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/576,775

(22) PCT Filed: Jan. 28, 2011

(86) PCT No.: PCT/EP2011/051246
§ 371 (c)(1),
(2), (4) Date: Aug. 2, 2012

(87) PCT Pub. No.: WO2011/095441
PCT Pub. Date: Aug. 11, 2011

(65) Prior Publication Data
US 2012/0321998 A1    Dec. 20, 2012

(30) Foreign Application Priority Data
Feb. 2, 2010 (EP) .................................... 10001006

(51) Int. Cl.
*G03H 1/28* (2006.01)
*G03H 1/02* (2006.01)
(Continued)

(52) U.S. Cl.
CPC ............ *G03F 7/027* (2013.01); *C08G 18/2815* (2013.01); *C08G 18/3812* (2013.01);
(Continued)

(58) Field of Classification Search
CPC ......... G03F 7/027; G03F 7/035; G03F 7/001; C08G 18/4825; C08G 18/485; C08G 18/48; C08G 18/44; C08G 18/2815; C08G 18/3812; G03C 1/733; G11B 7/24044; G11B 7/245; G03H 1/02; G03H 2260/12
See application file for complete search history.

(56) References Cited

U.S. PATENT DOCUMENTS 3,047,532 A * 7/1962 D'Alelio .......................... 525/45
4,230,740 A * 10/1980 Moyer ........................... 427/520
(Continued)

FOREIGN PATENT DOCUMENTS

EP 0223587 A1 5/1987
EP 0859283 A1 8/1998
(Continued)

OTHER PUBLICATIONS

Wypych, Handbook of Plasticizers, Chapter 2, pp. 7-71 (2004).*
(Continued)

*Primary Examiner* — Martin Angebranndt
(74) *Attorney, Agent, or Firm* — Drinker Biddle & Reath LLP

(57) ABSTRACT

The invention relates to a photopolymer formulation comprising polyurethane matrix polymers, writing monomers, and photoinitiators, wherein the writing monomers comprise compounds of formula (I), where R1, R2, R3 independent of each other are each a halogen atom or an organic radical, wherein at least one of the radicals is an organic radical comprising a radiation hardening group. The invention further relates to the use of the photopolymer formulation for producing holographic media.

10 Claims, 1 Drawing Sheet

(51) Int. Cl.

| | | |
|---|---|---|
| *C08G 18/38* | (2006.01) | |
| *C08G 18/44* | (2006.01) | |
| *C08G 18/48* | (2006.01) | |
| *G03F 7/027* | (2006.01) | |
| *G03C 1/73* | (2006.01) | |
| *C08G 18/28* | (2006.01) | |
| *G03F 7/00* | (2006.01) | |
| *G03F 7/035* | (2006.01) | |
| *G11B 7/24044* | (2013.01) | |
| *G11B 7/245* | (2006.01) | |

(52) U.S. Cl.
CPC ............... *C08G18/44* (2013.01); *C08G 18/48* (2013.01); *C08G 18/485* (2013.01); *C08G 18/4825* (2013.01); *G03C 1/733* (2013.01); *G03F 7/001* (2013.01); *G03F 7/035* (2013.01); *G03H 1/02* (2013.01); *G11B 7/245* (2013.01); *G11B 7/24044* (2013.01); *G03H 2001/0264* (2013.01); *G03H 2260/12* (2013.01)

(56) References Cited

U.S. PATENT DOCUMENTS

| | | | |
|---|---|---|---|
| 4,612,118 A * | 9/1986 | Kamiyama et al. | 210/490 |
| 4,942,112 A * | 7/1990 | Monroe et al. | 430/282.1 |
| 5,496,504 A | 3/1996 | Bonham et al. | |
| 5,702,846 A * | 12/1997 | Sato et al. | 430/2 |
| 5,747,629 A * | 5/1998 | Yeske et al. | 528/70 |
| 6,403,702 B1 * | 6/2002 | Markusch et al. | 524/590 |
| 6,569,916 B2 * | 5/2003 | Kim | 522/167 |
| 6,627,354 B1 * | 9/2003 | Chandross et al. | 430/1 |
| 7,879,509 B2 * | 2/2011 | Stockel et al. | 430/2 |
| 2003/0087104 A1 * | 5/2003 | Dhar et al. | 428/422.8 |
| 2005/0026081 A1 * | 2/2005 | Kawamura | 430/281.1 |
| 2008/0312403 A1 * | 12/2008 | Stockel et al. | 528/59 |
| 2009/0142672 A1 * | 6/2009 | Yamada | 430/2 |
| 2011/0236803 A1 * | 9/2011 | Weiser et al. | 430/2 |
| 2012/0214089 A1 * | 8/2012 | Honel et al. | 430/2 |
| 2012/0219885 A1 * | 8/2012 | Facke et al. | 430/2 |
| 2012/0231377 A1 * | 9/2012 | Weiser et al. | 430/2 |
| 2012/0237856 A1 * | 9/2012 | Rolle et al. | 430/2 |
| 2012/0302659 A1 * | 11/2012 | Rolle et al. | 522/173 |
| 2013/0224634 A1 * | 8/2013 | Berneth et al. | 430/2 |
| 2014/0038084 A1 * | 2/2014 | Honel et al. | 430/2 |

FOREIGN PATENT DOCUMENTS

| | | | |
|---|---|---|---|
| EP | 1229389 A1 | | 8/2002 |
| JP | 49125380 U | | 10/1974 |
| JP | 49-125380 | * | 11/1974 |
| JP | 56-152467 | * | 11/1981 |
| JP | 56152467 A | | 11/1981 |
| JP | 57-016446 | * | 1/1982 |
| JP | 58004027 A | | 1/1983 |
| JP | 09-028785 | * | 2/1997 |
| JP | 2003-302726 | * | 10/2003 |
| JP | 2004-300046 | * | 10/2004 |
| JP | 2004300046 A | | 10/2004 |
| JP | 2005-274625 | * | 10/2005 |
| JP | 2005-274626 | * | 10/2005 |
| JP | 2006-330655 | * | 12/2006 |
| KR | 684884 | * | 2/2007 |
| RU | 2006990 C1 | | 1/1994 |
| WO | WO-2008/125200 A1 | | 10/2008 |
| WO | WO-2008/125229 A1 | | 10/2008 |

OTHER PUBLICATIONS

Lee et al., "Synthesis of new photopolymeric methacrylate thioester with s-triazine ring for holographic recording" Opt. Mater., vol. 30 pp. 637-644 (2007).*

Kim et al. "3D images recording on photopolymer films containing molecular composites of a new s-triazine monomer and acrylate monomer by dual polymerization", J. Nannosci. Nanotech., vol. 8 (9) pp. 4702-4706 (2008).*

International Search Report for PCT/EP2011/051246 mailed May 10, 2011.

English translation of JP2003-302726.

* cited by examiner

PHOTOPOLYMER FORMULATION HAVING TRIAZINE-BASED WRITING MONOMERS

RELATED APPLICATIONS

This application is a national stage application (under 35 U.S.C. §371) of PCT/EP2011/051246, filed Jan. 28, 2011, which claims benefit of European Patent Application No. 10001006.5, filed Feb. 2, 2010.

The invention relates to a photopolymer formulation comprising polyurethane matrix polymers, writing monomers and photoinitiators. The invention further provides for the use of the photopolymer formulation for production of holographic media.

Photopolymers of the type mentioned at the outset are known in the prior art. For example, WO 2008/125229 A1 describes a photopolymer formulation which comprises polyurethane-based matrix polymers, an acrylate-based writing monomer and photoinitiators. In the cured state, the writing monomer and the photoinitiators are embedded in the polyurethane matrix in a three-dimensional isotrope distribution.

JP 2004 300046 A, EP 1 229 389 A1 and EP 0 859 283 A1 each disclose photopolymerizable formulations comprising matrix polymers, photoinitiators and triazine derivatives. However, none of the documents describes systems in which polyurethanes are used as matrix polymers.

For the uses of photopolymer formulations, the crucial role is played by the refractive index modulation $\Delta n$ caused by the holographic exposure in the photopolymer. On holographic exposure, the interference field composed of signal light beam and reference light beam (in the simplest case that of two plane waves) is imaged by the local photopolymerization of, for example, high-refractive acrylates at sites of high intensity in the interference field to give a refractive index grating. The refractive index grating in the photopolymer (the hologram) contains all information in the signal light beam. By illumination of the hologram only with the reference light beam, it is then possible to reconstruct the signal again. The strength of the signal thus reconstructed in relation to the intensity of the incident reference light is called diffraction efficiency, hereinafter DE.

In the simplest case of a hologram which arises from the superposition of two plane waves, the DE is calculated from the quotient of the intensity of the light diffracted on reconstruction and the sum of the intensities of incident reference light and diffracted light. The higher the DE, the more efficient is a hologram in relation to the luminance of the reference light necessary to make the signal visible with a fixed brightness.

High-refractive acrylates are capable of generating refractive index gratings with high amplitude between regions with low refractive index and regions with high refractive index, and hence of enabling, in photopolymer formulations, holograms with high DC and high $\Delta n$.

It should be noted that DE depends on the product of $\Delta n$ and the photopolymer layer thickness D. The greater the product, the greater the possible DE (for reflection holograms). The size of the angle range in which the hologram becomes visible (is reconstructed), for example in the case of monochromatic illumination, depends only on the layer thickness d.

In the case of illumination of the hologram with white light, for example, the size of the spectral range which can contribute to the reconstruction of the hologram likewise depends only on the layer thickness d. The smaller d is, the greater the respective acceptance widths. If the intention, therefore, is to produce bright-colored and readily visible holograms, the aim should be a high $\Delta n$ and a low thickness d, in such a way that DE is maximized. This means that, the higher $\Delta n$ is, the more latitude is achieved for configuration of the layer thickness d for bright-colored holograms without loss of DE. Therefore, the optimization of $\Delta n$ is of crucial significance in the optimization of photopolymer formulations (P. Hariharan, Optical Holography, 2nd Edition, Cambridge University Press, 1996).

In order to be able to achieve a maximum $\Delta n$ and DE in holograms, the matrix polymers and the writing monomers of a photopolymer formulation should in principle be selected such that they have very different refractive indices. In one embodiment, this means that matrix polymers with a minimum refractive index and writing monomers with a maximum refractive index are used. However, there are particular challenges in the case of this procedure: for instance, the effect of the high refractive index difference between matrix polymers and writing monomers is that the two components are not miscible to an unlimited degree, which is attributable to the structural differences in the components expressed in the refractive index difference. This means, more particularly, that the amount of writing monomer usable in the photopolymer formulation is limited, since excedence thereof results in separation of the components, which must absolutely be avoided. Otherwise, a medium from a corresponding formulation can lose its functionality or a hologram written into such a medium can even be damaged or destroyed subsequently.

However, there is also an interest in having photopolymer formulations with high contents of writing monomers, since it is thus firstly possible to produce brighter-colored holograms and secondly also to adjust mechanical properties in an advantageous manner, in order to enable good integration of the hologram into other materials.

Furthermore, the known photopolymer formulations frequently have a high viscosity, which considerably hinders the processing thereof. For example, it is difficult to apply the formulations homogeneously to a substrate to be coated. Major problems can also arise if the formulation is to be pumped. In this case, the only solution to date is to increase the temperature of the formulation in order thus to reduce the viscosity. However, this is critical with regard to the risk of an unwanted onset of polymerization of the formulation.

DETAIL DESCRIPTION OF THE INVENTION

Figure 1:
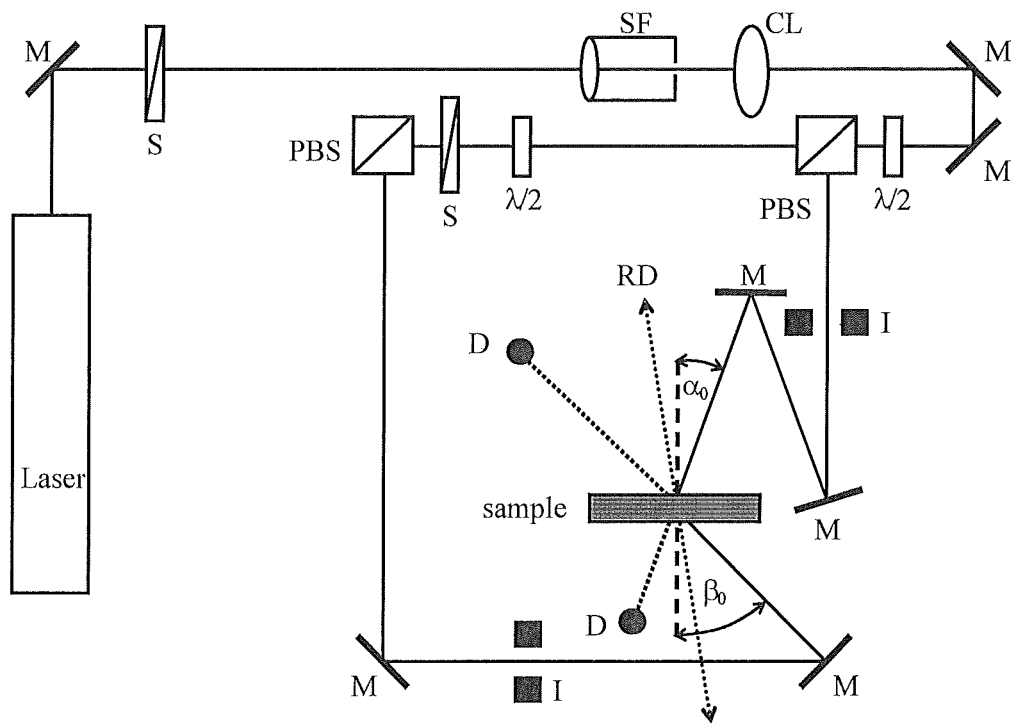
FIG. 1 shows a holographic test set-up used to measure diffraction efficiency.

It was therefore an object of the present invention to provide a photopolymer formulation which, compared to known formulations, has a lower viscosity, can contain a higher concentration of writing monomers without occurrence of the above-described adverse effects, and which can at the same time be used to obtain bright-colored holograms.

This object is achieved in the case of the inventive photopolymer formulation by virtue of the writing monomers comprising compounds of the formula (I)

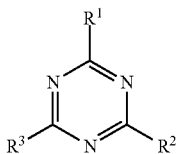

(I)

in which

R¹, R², R³ are each independently OH, halogen or an organic radical, where at least one of the radicals is an organic radical having a radiation-curing group.

Holograms which are written, for example, in films of the inventive photopolymer formulation are notable for their high brightness. In addition, it is possible to increase the concentration of writing monomers compared to known photopolymer formulations without occurrence of separation of the components of the formulation. The inventive photopolymer formulations are not least notable for a lower viscosity relative to the known formulations, which distinctly improves transportability and processability.

The compounds of the formula (I) can be obtained, for example, by reaction of the corresponding amines or alcohols with cyanuric chloride. This reaction is an amination or etherification. The reaction can be performed with the aid of known catalysts, for example tertiary amines, anilines or nitrogen-containing heterocycles, or inorganic bases.

The preparation of such compounds is described, for example, in SU 2006990 (1976) and JP 58004027.

In a preferred embodiment, it is envisaged that the organic radical(s) is/are bonded to the triazine ring via an oxygen or nitrogen atom.

It is additionally preferred when the radiation-curing group is an acrylate or methacrylate group.

Particular bright holograms can be obtained with photopolymer formulations comprising writing monomers in which R¹, R², R³ are each independently halogen and/or substituted or unsubstituted phenol, naphthol, aniline, naphthalene, 2-hydroxyethyl (meth)acrylate, hydroxypropyl (meth)acrylate and/or 4-hydroxybutyl (meth)acrylate radicals, where at least one of the R¹, R², R³ radicals is a 2-hydroxyethyl (meth)acrylate, hydroxypropyl (meth)acrylate or 4-hydroxybutyl (meth)acrylate radical.

It is further preferred when at least two of the R¹, R², R³ radicals are each independently a 2-hydroxyethyl (meth)acrylate, hydroxypropyl (meth)acrylate and/or 4-hydroxybutyl (meth)acrylate radical. In this case, the writing monomers of the formula (I) have a greater double bond density. This results in a higher reactivity, a higher conversion and more significant chemical crosslinking of the writing monomers in the polyacrylate which forms. The crosslinked writing monomers thus obtained have a higher mean molar mass than a linear polymer based on a monofunctional writing monomer, and are thus considerably more stable to diffusion and immobilized.

A greater double bond density can also be established as desired with the aid of mixtures of monofunctional writing monomers and those of higher double bond functionality.

The matrix polymers may especially be polyurethanes.

The polyurethanes are preferably obtainable by reaction of an isocyanate component a) with an isocyanate-reactive component b).

The isocyanate component a) preferably comprises polyisocyanates. The polyisocyanates used may be all compounds which have an average of two or more NCO functions per molecule and are well-known to the person skilled in the art, or mixtures thereof. These may have an aromatic, araliphatic, aliphatic or cycloaliphatic basis. It is also possible to use minor amounts of monoisocyanates and/or polyisocyanates containing unsaturated groups.

Suitable examples are butylene diisocyanate, hexamethylene diisocyanate (HDI), isophorone diisocyanate (IPDI), 1,8-diisocyanato-4-(isocyanatomethyl)octane, trimethylhexamethylene 2,2,4- and/or 2,4,4-diisocyanate, the isomeric bis(4,4'-isocyanatocyclohexyl)methane and mixtures thereof with any isomer content, isocyanatomethyloctane 1,8-diisocyanate, cyclohexylene 1,4-diisocyanate, the isomeric cyclohexanedimethylene diisocyanates, phenylene 1,4-diisocyanate, toluoylene 2,4- and/or 2,6-diisocyanate, naphthylene 1,5-diisocyanate, diphenylmethane 2,4'- or 4,4'-diisocyanate and/or triphenylmethane 4,4',4''-triisocyanate.

It is likewise possible to use derivatives of monomeric di- or triisocyanates with urethane, urea, carbodiimide, acylurea, isocyanurate, allophanate, biuret, oxadiazinetrion, uretdione and/or iminooxadiazinedione structures.

Preference is given to the use of polyisocyanates based on aliphatic and/or cycloaliphatic di- or triisocyanates.

More preferably, the polyisocyanates of component a) are di- or oligomerized aliphatic and/or cycloaliphatic di- or triisocyanates.

Very particularly preference is given to isocyanurates, uretdiones and/or iminooxadiazinediones based on HDI, 1,8-diisocyanato-4-(isocyanatomethyl)octane or mixtures thereof.

It is likewise possible to use, as component a), NCO-functional prepolymers with urethane, allophanate, biuret and/or amide groups. Prepolymers of component a) are obtained in a manner well known to those skilled in the art by reaction of monomeric, oligomeric or polyisocyanates a1) with isocyanate-reactive compounds a2) in suitable stoichiometry with optional use of catalysts and solvents.

Suitable polyisocyanates a1) are all aliphatic, cycloaliphatic, aromatic or araliphatic di- and triisocyanates known to those skilled in the art, and it is unimportant whether they have been obtained by means of phosgenation or by phosgene-free processes. In addition, it is also possible to use the higher molecular weight conversion products, well known per se to those skilled in the art, of monomeric di- and/or triisocyanates with urethane, urea, carbodiimide, acylurea, isocyanurate, allophanate, biuret, oxadiazinetrione, uretdione, iminooxadiazinedione structure, each individually or in any desired mixtures with one another.

Examples of suitable monomeric di- or triisocyanates which can be used as component a1) are butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyl-1,8-octane diisocyanate (TIN), 2,4- and/or 2,6-toluene diisocyanate.

The isocyanate-reactive compounds a2) used to form the prepolymers are preferably OH-functional compounds. These are analogous to the OH-functional compounds as described hereinafter for component b).

It is likewise possible to use amines for prepolymer preparation. Suitable examples are ethylenediamine, diethylenetriamine, triethylenetetramine, propylenediamine, diaminocyclohexane, diaminobenzene, diaminobisphenyl, difunctional polyamines, for example the Jeffamines®, amine-terminated polymers having number-average molar masses up to 10 000 g/mol, or any desired mixtures thereof with one another.

To prepare biuret group-containing prepolymers, isocyanate in excess is reacted with amine to form a biuret group.

Suitable amines in this case for the reaction with the di-, tri- and polyisocyanates mentioned are all oligomeric or polymeric, primary or secondary, difunctional amines of the type mentioned above.

Preferred prepolymers are urethanes, allophanates or biurets formed from aliphatic isocyanate-functional compounds and oligomeric or polymeric isocyanate-reactive compounds having number-average molar masses of 200 to 10 000 g/mol; particular preference is given to urethanes, allophanates or biurets formed from aliphatic isocyanate-functional compounds and oligomeric or polymeric polyols or polyamines having number-average molar masses of 500 to 8500 g/mol, and particular preference is given to allophanates formed from HDI or TMDI and difunctional polyether polyols having number-average molar masses of 1000 to 8200 g/mol.

Preferably, the above-described prepolymers have residual contents of free monomeric isocyanate of less than 1% by weight, more preferably less than 0.5% by weight, most preferably less than 0.2% by weight.

It will be appreciated that the isocyanate component may contain proportions of further isocyanate components in addition to the prepolymers described. Useful for this purpose are aromatic, araliphatic, aliphatic and cycloaliphatic di-, tri- or polyisocyanates. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate (TMDI), the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, triphenylmethane 4,4',4"-triisocyanate or derivatives thereof having a urethane, urea, carbodiimide, acylurea, isocyanurate, allophanate, biuret, oxadiazinetrione, uretdione or iminooxadiazinedione structure and mixtures thereof. Preference is given to polyisocyanates based on oligomerized and/or derivatized diisocyanates which have been freed of excess diisocyanate by suitable processes, especially those of hexamethylene diisocyanate. Particular preference is given to the oligomeric isocyanurates, uretdiones and iminooxadiazinediones of HDI and mixtures thereof.

It is optionally also possible for the isocyanate component a) to contain proportions of isocyanates which have been partially reacted with isocyanate-reactive ethylenically unsaturated compounds. Preference is given here to using, as isocyanate-reactive ethylenically unsaturated compounds, α,β-unsaturated carboxylic acid derivatives such as acrylates, methacrylates, maleates, fumarates, maleimides, acrylamides, and vinyl ethers, propenyl ethers, allyl ethers and compounds which contain dicyclopentadienyl units and have at least one group reactive toward isocyanates. These are more preferably acrylates and methacrylates having at least one isocyanate-reactive group. Useful hydroxy-functional acrylates or methacrylates include, for example, compounds such as 2-hydroxyethyl (meth)acrylate, polyethylene oxide mono(meth)acrylates, polypropylene oxide mono-(meth)acrylates, polyalkylene oxide mono(meth)acrylates, poly(ε-caprolactone) mono(meth)acrylates, for example Tone® M100 (Dow, USA), 2-hydroxypropyl (meth)acrylate, 4-hydroxybutyl (meth)acrylate, 3-hydroxy-2,2-dimethylpropyl (meth)acrylate, the hydroxy-functional mono-, di- or tetra (meth)acrylates of polyhydric alcohols such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof. In addition, isocyanate-reactive oligomeric or polymeric unsaturated compounds containing acrylate and/or methacrylate groups are suitable, alone or in combination with the abovementioned monomeric compounds. The proportion of isocyanates in the isocyanate component a) which have been partially reacted with isocyanate-reactive ethylenically unsaturated compounds is 0 to 99%, preferably 0 to 50%, more preferably 0 to 25% and most preferably 0 to 15%.

It is optionally also possible for the aforementioned isocyanate component a) to contain entirely, or proportions of, isocyanates which have been reacted completely or partially with blocking agents known to the person skilled in the art from coating technology. Examples of blocking agents include: alcohols, lactams, oximes, malonic esters, alkyl acetoacetates, triazoles, phenols, imidazoles, pyrazoles and amines, for example butanone oxime, diisopropylamine, 1,2,4-triazole, dimethyl-1,2,4-triazole, imidazole, diethyl malonate, ethyl acetoacetate, acetone oxime, 3,5-dimethylpyrazole, ε-caprolactam, N-tert-butylbenzylamine, cyclopentanone carboxyethyl ester or any desired mixtures of these blocking agents.

As component b), it is possible in principle to use all polyfunctional, isocyanate-reactive compounds which have an average of at least 1.5 isocyanate-reactive groups per molecule.

In the context of the present invention, isocyanate-reactive groups are preferably hydroxyl, amino or thio groups; particular preference is given to hydroxyl compounds.

Suitable polyfunctional, isocyanate-reactive compounds are, for example, polyester polyols, polyether polyols, polycarbonate polyols, poly(meth)acrylate polyols and/or polyurethane polyols.

Suitable polyester polyols are, for example, linear polyester diols or branched polyester polyols, as obtained in a known manner from aliphatic, cycloaliphatic or aromatic di- or polycarboxylic acids or their anhydrides with polyhydric alcohols having an OH functionality of ≥2.

Examples of such di- or polycarboxylic acids or anhydrides are succinic acid, glutaric acid, adipic acid, pimelic acid, suberic acid, azelaic acid, sebacic acid, nonanedicarboxylic acid, decanedicarboxylic acid, terephthalic acid, isophthalic acid, o-phthalic acid, tetrahydrophthalic acid, hexahydrophthalic acid or trimellitic acid, and acid anhydrides such as o-phthalic anhydride, trimellitic anhydride or succinic anhydride, or any desired mixtures thereof with one another.

Examples of suitable alcohols are ethanediol, di-, tri- and tetraethylene glycol, 1,2-propanediol, di-, tri- and tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

The polyester polyols may also be based on natural raw materials, such as castor oil. It is also possible for the polyester polyols to be based on homo- or copolymers of lactones, as can preferably be obtained by an addition of lactones or lactone mixtures, such as butyrolactone, s-caprolactone and/or methyl-ε-caprolactone, onto hydroxy-functional compounds, such as polyhydric alcohols having an OH functionality of ≥2, for example of the aforementioned type.

Such polyester polyols preferably have number-average molar masses of 400 to 4000 g/mol, more preferably of 500 to 2000 g/mol. Their OH functionality is preferably 1.5 to 3.5, more preferably 1.8 to 3.0.

Suitable polycarbonate polyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned in the context of the polyester segments and having an OH functionality of ≥2, preferably 1,4-butanediol, 1,6-hexanediol and/or 3-methylpentanediol, or polyester polyols can also be converted into polycarbonate polyols.

Such polycarbonate polyols preferably have number-average molar masses of 400 to 4000 g/mol, more preferably of 500 to 2000 g/mol. The OH functionality of these polyols is preferably 1.8 to 3.2, more preferably 1.9 to 3.0.

Suitable polyether polyols are polyaddition products of cyclic ethers onto OH- or NH-functional starter molecules, said products optionally having a block structure.

Suitable cyclic ethers are, for example, styrene oxides, ethylene oxide, propylene oxide, tetrahydrofuran, butylene oxide, epichlorohydrin and any desired mixtures thereof.

The starters used may be the polyhydric alcohols mentioned in connection with the polyester polyols and having an OH functionality of ≥2, and also primary or secondary amines and amino alcohols.

Preferred polyether polyols are those of the aforementioned type based exclusively on propylene oxide or random or block copolymers based on propylene oxide with further 1-alkylene oxides, where the 1-alkylene oxide content is not higher than 80% by weight. Additionally preferred are poly(trimethylene oxide)s of the formula (III) and mixtures of the polyols specified as preferred. Particular preference is given to propylene oxide homopolymers and random or block copolymers which have oxyethylene, oxypropylene and/or oxybutylene units, where the proportion of the oxypropylene units, based on the total proportion of all oxyethylene, oxypropylene and oxybutylene units, amounts to at least 20% by weight, preferably at least 45% by weight. Oxypropylene and oxybutylene here include all respective linear and branched C3 and C4 isomers.

Such polyether polyols preferably have number-average molar masses of 250 to 10 000 g/mol, more preferably of 500 to 8500 g/mol and most preferably of 600 to 4500 g/mol. The OH functionality is preferably 1.5 to 4.0, more preferably 1.8 to 3.1.

In addition, suitable constituents of component b), as polyfunctional isocyanate-reactive compounds, are also low in molecular weight, i.e. have molecular weights of less than 500 g/mol, short-chain, i.e. containing 2 to 20 carbon atoms, aliphatic, araliphatic or cycloaliphatic di-, tri- or polyfunctional alcohols.

These may be, for example, ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butyl-propanediol, trimethylpentanediol, positionally isomeric diethyloctanediols, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropyl 2,2-dimethyl-3-hydroxypropionate. Examples of suitable triols are trimethylolethane, trimethylolpropane or glycerol. Suitable higher-functionality alcohols are ditrimethylolpropane, pentaerythritol, dipentaerythritol or sorbitol.

The photoinitiators used are typically initiators which can be activated by actinic radiation and initiate polymerization of the corresponding polymerizable groups. Photoinitiators are commercially distributed compounds known per se, in the case of which a distinction is made between monomolecular (type I) and bimolecular (type II) initiators. Furthermore, depending on the chemical nature, these initiators are used for the free-radical, the anionic (or), the cationic (or mixed) forms of the aforementioned polymerizations.

The photoinitiators may especially comprise an anionic, cationic or uncharged dye and a coinitiator.

(Type I) systems for free-radical photopolymerization are, for example, aromatic ketone compounds, e.g. benzophenones, in combination with tertiary amines, alkylbenzophenones, 4,4'-bis(dimethylamino)benzophenone (Michler's ketone), anthrone and halogenated benzophenones or mixtures of said types. More suitable are (type II) initiators, such as benzoin and its derivatives, benzil ketals, acylphosphine oxides, e.g. 2,4,6-trimethylbenzoyldiphenylphosphine oxide, bisacylophosphine oxide, phenylglyoxylic esters, camphorquinone, alpha-aminoalkylphenone, alpha,alpha-dialkoxyacetophenone, 1-[4-(phenylthio)phenyl]octane-1,2-dione 2-(O-benzoyloxime) and alpha-hydroxyalkylphenone.

The photoinitiator systems which are described in EP-A 0223587 and consist of a mixture of an ammonium arylborate and one or more dyes can also be used as a photoinitiator. Suitable ammonium arylborates are, for example, tetrabutylammonium triphenylhexylborate, tetrabutylammonium triphenylbutylborate, tetrabutylammonium trinapthylhexylborate, tetrabutylammonium tris(4-tert-butyl)phenylbutylborate, tetrabutylammonium tris(3-fluorophenyl)hexylborate, tetramethylammonium triphenylbenzylborate, tetra(n-hexyl)ammonium (sec-butyl)triphenylborate, 1-methyl-3-octylimidazolium dipentyldiphenylborate and tetrabutylammonium tris(3-chloro-4-methylphenyl)hexylborate. Suitable dyes are, for example, new methylene blue, thionine, basic yellow, pinacynol chloride, rhodamine 6G, gallocyanine, ethyl violet, victoria blue R, celestine blue, quinaldine red, crystal violet, brilliant green, astrazone orange G, darrow red, pyronine Y, basic red 29, pyrillium I, cyanine and methylene blue, azure A (Cunningham et al., RadTech'98 North America UV/EB Conference Proceedings, Chicago, Apr. 19-22, 1998).

The photoinitiators used for the anionic polymerization are generally (type I) systems and derive from transition metal complexes of the first series. Here are chromium salts, for example trans-$Cr(NH_3)_2(NCS)_4^-$ (Kutal et al, Macromolecules 1991, 24, 6872) or ferrocenyl compounds (Yamaguchi et al. Macromolecules 2000, 33, 1152). A further means of anionic polymerization consists in the use of dyes, such as crystal violet leuconitrile or malchite green leuconitrile, which can polymerize cyanoacrylates by photolytic decomposition (Neckers et al. Macromolecules 2000, 33, 7761). However, this incorporates the chromophore into the polymer, such that the resulting polymers are colored throughout.

The photoinitiators used for the cationic polymerization consist essentially of three classes: aryldiazonium salts, onium salts (here especially: iodonium, sulfonium and selenonium salts) and organometallic compounds. When irradiated either in the presence or in the absence of a hydrogen donor, phenyldiazonium salts can produce a cation that initiates the polymerization. The efficiency of the overall system is determined by the nature of the counterion used for the diazonium compound. Preference is given here to the relatively unreactive but quite expensive $SbF_6^-$, $AsF_6^-$ or $PF_6^-$. These compounds are generally not very suitable for use in coating of thin films, since the nitrogen released after the exposure the surface quality is lowered (pinholes) (Li et al., Polymeric Materials Science and Engineering, 2001, 84, 139).

Onium salts, especially sulfonium and iodonium salts, are very widely used, and also commercially available in a variety of forms. The photochemistry of these compounds has been investigated over a long period. The iodonium salts decompose, at first homolytically, after excitation and thus produce a free radical and a free-radical anion which is stabilized by hydrogen abstraction and releases a proton and then initiates the cationic polymerization (Dektar et al. J. Org. Chem. 1990, 55, 639; J. Org. Chem., 1991, 56, 1838). This mechanism enables the use of iodonium salts likewise for free-radical photopolymerization. In this context, the selection of the counterion is again of great importance; preference is likewise given to $SbF_6^-$, $AsF_6^-$ or $PF_6^-$. In this structure class, the selection of the substitution of the aromatic is otherwise quite unrestricted and is determined substantially by the availability of suitable starting units for the synthesis.

The sulfonium salts are compounds which decompose according to Norrish(II) (Crivello et al., Macromolecules, 2000, 33, 825). In the case of sulfonium salts too, the selection of the counterion is of critical importance, which manifests itself substantially in the curing rate of the polymers. The best results are generally achieved with $SbF_6^-$ salts.

Since the intrinsic absorption of iodonium and sulfonium salts is at <300 nm, these compounds have to be sensitized appropriately for the photopolymerization with near UV or short-wave visible light. This is accomplished by the use of relatively highly absorbing aromatics, for example anthracene and derivatives (Gu et al., Am. Chem. Soc. Polymer Preprints, 2000, 41 (2), 1266) or phenothiazine or derivatives thereof (Hua et al, Macromolecules 2001, 34, 2488-2494).

It may be advantageous also to use mixtures of these compounds. Depending on the radiation source used for the curing, type and concentration of photoinitiator must be adapted in a manner known to a person skilled in the art. Further details can be found, for example, in P. K. T. Oldring (Ed.), Chemistry & Technology of UV & EB Formulations For Coatings, Inks & Paints, Vol. 3, 1991, SITA Technology, London, p. 61-328.

Preferred photoinitiators are mixtures of tetrabutylammonium tetrahexylborate, tetrabutylammonium triphenylhexylborate, tetrabutylammonium tris(3-fluorophenyl)-hexylborate ([191726-69-9], CGI 7460, product of Ciba Inc, Basle) and tetrabutylammonium tris(3-chloro-4-methylphenyl) hexylborate ([1147315-11-4], CGI 909, product of Ciba Inc, Basle), with dyes, for example astrazone orange G, methylene blue, new methylene blue, azure A, pyrillium I, safranine O, cyanine, gallocyanine, brilliant green, crystal violet, ethyl violet and thionine.

In a further preferred embodiment, the photopolymer formulation additionally comprises urethanes as plasticizers, where the urethanes may especially be substituted by at least one fluorine atom.

The urethanes may preferably have the general formula (II)

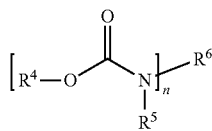

(II)

in which n≥1 and n≥8 and $R^4$, $R^5$, $R^6$ are each independently hydrogen, linear, branched, cyclic or heterocyclic organic radicals which are unsubstituted or else optionally substituted by heteroatoms, where preferably at least one of the $R^4$, $R^5$, $R^6$ radicals is substituted by at least one fluorine atom, and $R^4$ is more preferably an organic radical with at least one fluorine atom. More preferably, $R^6$ is a linear, branched, cyclic or heterocyclic organic radical which is unsubstituted or else optionally substituted by heteroatoms, for example fluorine.

In a further preferred embodiment, the writing monomers additionally comprise a further mono- or polyfunctional writing monomer, which may especially be a mono- or polyfunctional acrylate.

The acrylate may especially have the general formula (III)

(III)

in which m≥1 and m≥4 and $R^7$, $R^8$ are each independently hydrogen, linear, branched, cyclic or heterocyclic organic radicals which are unsubstituted or else optionally substituted by heteroatoms. More preferably, $R^8$ is hydrogen or methyl and/or $R^7$ is a linear, branched, cyclic or heterocyclic organic radical which is unsubstituted or else optionally substituted by heteroatoms.

It is likewise possible that further unsaturated compounds are added, such as α,β-unsaturated carboxylic acid derivatives such as acrylates, methacrylates, maleates, fumarates, maleimides, acrylamides, and also vinyl ethers, propenyl ethers, allyl ethers, and compounds containing dicyclopentadienyl units, and also olefinically unsaturated compounds, for example styrene, α-methylstyrene, vinyltoluene, olefinines, for example 1-octene and/or 1-decene, vinyl esters, (meth) acrylonitrile, (meth)acrylamide, methacrylic acid, acrylic acid. Preference is given to acrylates and methacrylates.

Acrylates or methacrylates generally refer to esters of acrylic acid or methacrylic acid. Examples of usable acrylates and methacrylates are methyl acrylate, methyl methacrylate, ethyl acrylate, ethyl methacrylate, ethoxyethyl acrylate, ethoxyethyl methacrylate, n-butyl acrylate, n-butyl methacrylate, tert-butyl acrylate, tert-butyl methacrylate, hexyl acrylate, hexyl methacrylate, 2-ethylhexyl acrylate, 2-ethylhexyl methacrylate, butoxyethyl acrylate, butoxyethyl methacrylate, lauryl acrylate, lauryl methacrylate, isobornyl acrylate, isobornyl methacrylate, phenyl acrylate, phenyl methacrylate, p-chlorophenyl acrylate, p-chlorophenyl methacrylate, p-bromophenyl acrylate, p-bromophenyl methacrylate, 2,4,6-trichlorophenyl acrylate, 2,4,6-trichlorophenyl methacrylate, 2,4,6-tribromophenyl acrylate, 2,4,6-tribromophenyl methacrylate, pentachlorophenyl acrylate, pentachlorophenyl methacrylate, pentabromophenyl acrylate, pentabromophenyl methacrylate, pentabromobenzyl acrylate, pentabromobenzyl methacrylate, phenoxyethyl acrylate, phenoxyethyl methacrylate, phenoxyethoxyethyl acrylate, phenoxyethoxyethyl methacrylate, phenylthioethyl acrylate, phenylthioethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, propane-2,2-diylbis[(2,6-dibromo-4,1-phenylene)oxy(2-{[3,3,3-tris(4-chlorophenyl)propanoyl]oxy}-propane-3,1-diyl)oxyethane-2,1-diyl]diacrylate, bisphenol A diacrylate, bisphenol A dimethacrylate, tetrabromobisphenol A diacrylate, tetrabromobisphenol A dimethacrylate and the ethoxylated analog compounds thereof, N-carbazolyl acrylates, to name merely a selection of usable acrylates and methacrylates.

It is of course also possible to use urethane acrylates. Urethane acrylates are understood to mean compounds having at least one acrylic ester group, and additionally having at least one urethane bond. It is known that such compounds can be obtained by reacting a hydroxy-functional acrylic ester with an isocyanate-functional compound.

Examples of isocyanate-functional compounds usable for this purpose are aromatic, araliphatic, aliphatic and cycloaliphatic di-, tri- or polyisocyanates. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, 1,5-naphthylene diisocyanate, m-methylthiophenyl isocyanate, triphenylmethane 4,4',4''-triisocyanate and tris(p-isocyanatophenyl) thiophosphate or derivatives thereof having a urethane, urea, carbodiimide, acylurea, isocyanurate, allophanate, biuret, oxadiazinetrione, uretdione or iminooxadiazinedione structure and mixtures thereof. Preference is given to aromatic or araliphatic di-, tri- or polyisocyanates.

Useful hydroxy-functional acrylates or methacrylates for the preparation of urethane acrylates include, for example, compounds such as 2-hydroxyethyl (meth)acrylate, polyethylene oxide mono(meth)acrylates, polypropylene oxide mono(meth)acrylates, polyalkylene oxide mono(meth)acrylates, poly(ε-caprolactone) mono(meth)acrylates, for example Tone® M100 (Dow, Schwalbach, Germany), 2-hydroxypropyl (meth)acrylate, 4-hydroxybutyl (meth)acrylate, 3-hydroxy-2,2-dimethylpropyl (meth)acrylate, hydroxypropyl (meth)acrylate, 2-hydroxy-3-phenoxypropyl acrylate, the hydroxy-functional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof. Preference is given to 2-hydroxyethyl acrylate, hydroxypropyl acrylate, 4-hydroxybutyl acrylate and poly(ε-caprolactone) mono(meth) acrylates. In addition, are suitable as isocyanate-reactive oligomeric or polymeric unsaturated compounds containing acrylate and/or methacrylate groups, alone or in combination with the abovementioned monomeric compounds. It is likewise possible to use the epoxy (meth)acrylates known per se, containing hydroxyl groups and having OH contents of 20 to 300 mg KOH/g or polyurethane (meth)acrylates containing hydroxyl groups and having OH contents of 20 to 300 mg KOH/g or acrylated polyacrylates having OH contents of 20 to 300 mg KOH/g and mixtures thereof with one another and mixtures with unsaturated polyesters containing hydroxyl groups and mixtures with polyester (meth)acrylates or mixtures of unsaturated polyesters containing hydroxyl groups with polyester (meth)acrylates.

Preference is given especially to urethane acrylates obtainable from the reaction of tris(p-isocyanatophenyl) thiophosphate and m-methylthiophenyl isocyanate with alcohol-functional acrylates such as 2-hydroxyethyl (meth)acrylate, hydroxypropyl (meth)acrylate and 4-hydroxybutyl (meth)acrylate.

The invention further provides for the use of an inventive photopolymer formulation for production of holographic media which can be processed to holograms by appropriate exposure operations for optical applications in the entire visible and near UV ranges (300-800 nm). Visual holograms include all holograms which can be recorded by methods known to the person skilled in the art. These include in-line (Gabor) holograms, off-axis holograms, full-aperture transfer holograms, white light transmission holograms ("rainbow holograms"), Denisyuk holograms, off-axis reflection holograms, edge-lit holograms and holographic stereograms. Preference is given to reflection holograms, Denisyuk holograms and transmission holograms.

Possible optical functions of the holograms which can be produced with the inventive photopolymer formulations correspond to the optical functions of optical elements such as lenses, mirrors, deflecting mirrors, filters, diffusion discs, diffraction elements, light conductors, waveguides, projection screens and/or masks. Frequently, these optical elements show a frequency selectivity, depending on how the holograms were exposed and the dimensions of the hologram.

In addition, the inventive photopolymer formulations can also be used to produce holographic images or representations, for example for personal portraits, biometric representations in security documents, or generally images or image structures for advertising, security labels, brand protection, branding, labels, design elements, decorations, illustrations, collectable cards, images and the like, and images which can represent digital data, including in combination with the products described above. Holographic images can have the impression of a three-dimensional image, but they can also show image sequences, short films or a number of different objects, depending on the angle from which they are illuminated, the light source with which they are illuminated (including moving ones), etc. Owing to these various possible designs, holograms, especially volume holograms, are an attractive technical solution for the abovementioned application.

The photopolymer formulations can especially be used as a holographic medium in the form of a film. In this case, as a carrier, a layer of a material or material composite which is transparent to light in the visible spectral range (transmission greater than 85% in the wavelength range from 400 to 780 nm) is coated on one or both sides, and a covering layer is optionally applied to the photopolymer layer(s).

Preferred materials or material composites of the carrier are based on polycarbonate (PC), polyethylene terephthalate (PET), polybutylene terephthalate, polyethylene, polypropylene, cellulose acetate, cellulose hydrate, cellulose nitrate, cycloolefin polymers, polystyrene, polyepoxides, polysulfon, cellulose triacetate (CTA), polyamide, polymethyl methacrylate, polyvinyl chloride, polyvinyl butyral or polydicyclopentadiene, or mixtures thereof. They are more preferably based on PC, PET and CTA. Material composites may be film laminates or coextrudates. Preferred material composites are duplex and triplex films formed according to one of the schemes A/B, A/B/A or AB/C. Particular preference is given to PC/PET, PET/PC/PET and PC/TPU (TPU=thermoplastic polyurethane).

As an alternative to the aforementioned polymeric carriers, it is also possible to use planar glass sheets which are used especially for large-area exposures with true reproduction, for example for holographic lithography (Ng, Willie W.; Hong, Chi-Shain; Yariv, Amnon. Holographic interference lithography for integrated optics. IEEE Transactions on Electron Devices (1978), ED-25(10), 1193-1200, ISSN:0018-9383).

The materials or material composites of the carrier may be given an antiadhesive, antistastic, hydrophobized or hyrophilized finish on one or both sides. The modifications mentioned serve the purpose, on the side facing the photopolymer layer, of making the photopolymer layer detachable without destruction from the carrier. Modification of the side of the carrier facing away from the photopolymer layer serves to ensure that the inventive media satisfy specific mechanical requirements which exist, for example, in the case of processing in roll laminators, especially in roll-to-roll processes.

The invention further provides for the use of a compound of the formula (I) as a writing monomer in a photopolymer formulation.

EXAMPLES

The invention is illustrated in detail hereinafter with reference to examples. Unless stated otherwise, all percentages should be understood as percentages by weight.

Methods:

The solids contents were determined by either applying about 1 g of substance to a special disposable aluminum pan, observing the operating instructions of IR balance, and heating at 140° C. until there is constant weight for 30 seconds, or applying about 1 g of substance to a special disposable aluminum pan (suitable for systems with a maximum solvents content of 10% by weight) and heating in a drying cabinet at 125° C. for 60 minutes. In the course of this, the substance to be determined is distributed with the aid of a suitably bent paperclip so as to ensure homogeneous drying of the film. The paperclip remains in the sample for the measurement and has to be taken into account at the initial weighing stage.

The NCO values (isocyanate contents) reported were determined to DIN EN ISO 11909.

The determination of the content of 2-hydroxyethyl acrylate (HEA) is performed based on DIN/ISO 10283 (2007). 1.41 g of anthracene (calibration substance) as an internal standard substance are weighed into a 1 liter standard flask and made up with ethyl acetate. About 1 g of sample is weighed in and 10 ml of the solution of the internal standard prepared as described above and 10 ml of ethyl acetate are added, and 2.0 μl thereof are separated by gas chromatography and the HEA content is calculated in % by weight with area correction.

The viscosity was determined on a CP25-1 from Anton Paar (Ostfildern, Germany) by means of cone-plate construction to ISO 3214 and reported in mPa*s.

Measurement of the refractive index at a wavelength of 405 nm (method A): the refractive index n as a function of wavelength for the samples was obtained from the transmission and reflection spectra. For this purpose, a film of thickness about 100-300 nm of the samples was spun onto quartz glass slides from dilute solution in butyl acetate. The transmission and reflection spectrum of this layer combination was measured with a spectrometer from STEAG ETA-Optik, CD-Measurement System ETA-RT, and then the layer thickness and the spectral plot of n were fitted to the transmission and reflection spectrum measured. This is done with the internal software of the spectrometer and additionally requires the n data of the quartz glass substrate which had been determined beforehand in a blank measurement.

Measurement of the refractive index at a wavelength of 589 nm (method B): a sample of the example compound was given an Abbe refractometer and nD was measured.

A holographic test setup as shown in FIG. 1 was used to measure the diffraction efficiency (DE) of the media.

The beam of an He—Ne laser (emission wavelength 633 nm) was converted to a parallel homogeneous beam with the aid of the spatial filter (SF) together with the collimator lens (CL). The final cross sections of the signal and reference beam are fixed by the iris apertures (I). The diameter of the iris aperture is 0.4 cm. The polarization-dependent beam splitters (PBS) divide the laser beam into two coherent beams with the same polarization. The α/2 plates were used to adjust the power of the reference beam to 0.5 mW and the power of the signal beam to 0.65 mW. The powers were determined with the semiconductor detectors (D) with the sample removed. The angle of incidence ($\alpha_0$) of the reference beam is −21.8°; the angle of incidence ($\beta_0$) of the signal beam is 41.8°. The angles are measured proceeding from the sample normal to the beam direction. According to FIG. 1, $\alpha_0$ therefore has a negative sign and $\beta_0$ a positive sign. At the location of the sample (medium), the interference field of the two overlapping beams produced a grating of light and dark strips perpendicular to the angle bisector of the two beams incident on the sample (reflection hologram). The strip spacing Λ, also called lattice period, in the medium is ~225 nm (the refractive index of the medium is assumed to be ~1.504).

FIG. 1 shows the geometry of a holographic media tester (HMT) and λ=633 nm (He—Ne laser): M=mirror, S=shutter, SF=spatial filter, CL=collimator lens, λ/2=λ/2 plate, PBS=polarization-sensitive beam splitter, D=detector, I=iris aperture, $\alpha_0$=−21.8°, $\beta_0$=41.8° are the angles of incidence of the coherent beams measured outside the sample (outside the medium). RD=reference direction of the turntable.

A holographic test setup as shown in FIG. 1 was used to measure the diffraction efficiency (DE) of the media.

Holograms were recorded in the medium in the following manner:

Both shutters (S) are opened for the exposure time t.

Thereafter, with the shutters (S) closed, the medium is allowed 5 minutes for the diffusion of the as yet unpolymerized writing monomers.

The holograms recorded were then reconstructed in the following manner. The shutter of the signal beam remained closed. The shutter of the reference beam was opened. The iris aperture of the reference beam was closed to a diameter of <1 mm. This ensured that the beam was always completely within the previously recorded hologram for all angles of rotation (Ω) of the medium. The turntable, under computer control, covered the angle range from $\Omega_{min}$ to $\Omega_{max}$ with an angle step width of 0.05°. Ω is measured from the sample normal to the reference direction of the turntable. The reference direction of the turntable is obtained when the angles of incidence of the reference beam and of the signal beam have the same absolute value on recording of the hologram, i.e. $\alpha_0$=−31.8° and $\beta_0$=31.8°. In that case, $\Omega_{recording}$=0°. When $\alpha_0$=−21.8° and $\beta_0$=41.8°, $\Omega_{recording}$ is therefore 10°. In general, for the interference field in the course of recording of the hologram:

$$\alpha_0 = \theta_0 + \Omega_{recording}.$$

$\theta_0$ is the semiangle in the laboratory system outside the medium and, in the course of recording of the hologram:

$$\theta_0 = \frac{\alpha_0 - \beta_0}{2}.$$

In this case, $\theta_0$ is thus −31.8°. At each setting for the angle of rotation Ω, the powers of the beam transmitted in zeroth order were measured by means of the corresponding detector D, and the powers of the beam diffracted in first order by means of the detector D. The diffraction efficiency was calculated at each setting of angle Ω as the quotient of:

$$\eta = \frac{P_D}{P_D + P_T}$$

$P_D$ is the power in the detector for the diffracted beam and $P_T$ is the power in the detector for the transmitted beam.

By means of the process described above, the Bragg curve, which describes the diffraction efficiency η as a function of the angle of rotation Ω, for the recorded hologram was measured and saved on a computer. In addition, the intensity transmitted into the zeroth order was recorded against the angle of rotation Ω and saved on a computer.

The maximum diffraction efficiency (DE=$\eta_{max}$) of the hologram, i.e. the peak value thereof, was determined at $\Omega_{reconstruction}$. It may have been necessary for this purpose to change the position of the detector for the diffracted beam in order to determine this maximum value.

The refractive index contrast Δn and the thickness d of the photopolymer layer were now determined by means of coupled wave theory (see: H. Kogelnik, The Bell System Technical Journal, Volume 48, November 1969, Number 9 page 2909-page 2947) from the measured Bragg curve and the variation of the transmitted intensity with angle. It should be noted that, owing to the shrinkage in thickness which occurs as a result of the photopolymerization, the strip spacing Λ' of the hologram and the orientation of the strips (slant) can differ from the strip spacing Λ of the interference pattern and the orientation thereof. Accordingly, the angle $\alpha_0$' and the corresponding angle of the turntable a $\Omega_{reconstruction}$ at which maximum diffraction efficiency is achieved will also differ from $\alpha_0$ and from the corresponding a $\Omega_{recording}$. This alters the Bragg condition. This alteration is taken into account in the evaluation process. The evaluation process is described hereinafter:

All geometric parameters which relate to the recorded hologram and not to the interference pattern are shown as parameters with primes.

For the Bragg curve η(Ω) of a reflection hologram, according to Kogelnik:

$$\eta = \begin{cases} \dfrac{1}{1 - \dfrac{1 - (\xi/\nu)^2}{\sin^2(\sqrt{\xi^2 - \nu^2})}}, & \text{when } \nu^2 - \xi^2 < 0 \\ \dfrac{1}{1 + \dfrac{1 - (\xi/\nu)^2}{\sinh^2(\sqrt{\nu^2 - \xi^2})}}, & \text{when } \nu^2 - \xi^2 \geq 0 \end{cases}$$

where:

$$\nu = \frac{\pi \cdot \Delta n \cdot d'}{\lambda \cdot \sqrt{|c_s \cdot c_r|}}$$

$$\xi = -\frac{d'}{2 \cdot c_s} \cdot DP$$

$$c_s = \cos(\vartheta') - \cos(\psi') \cdot \frac{\lambda}{n \cdot \Lambda'}$$

$$c_r = \cos(\vartheta')$$

$$DP = \frac{\pi}{\Lambda'} \cdot \left(2 \cdot \cos(\psi' - \vartheta') - \frac{\lambda}{n \cdot \Lambda'}\right)$$

$$\psi' = \frac{\beta' + \alpha'}{2}$$

$$\Lambda' = \frac{\lambda}{2 \cdot n \cdot \cos(\psi' - \alpha')}$$

In the reconstruction of the hologram, as explained analogously above:

$$\theta'_0 = \theta_0 + \Omega$$

$$\sin(\theta'_0) = n \cdot \sin(\theta')$$

Under the Bragg condition, the dephasing DP=0. And it follows correspondingly:

$$\alpha'_0 = \theta_0 + \Omega_{reconstruction}$$

$$\sin(\alpha'_0) = n \cdot \sin(\alpha')$$

The still unknown angle β' can be determined from the comparison of the Bragg condition of the interference field in the course of recording of the hologram and the Bragg condition in the course of reconstruction of the hologram, assuming that only shrinkage in thickness takes place. It then follows that:

$$\sin(\beta') = \frac{1}{n} \cdot [\sin(\alpha_0) + \sin(\beta_0) - \sin(\theta_0 + \Omega_{reconstruction})]$$

ν is the grating thickness, ξ is the detuning parameter and ψ' is the orientation (slant) of the refractive index grating which has been recorded. α' and β' corresponds to the angles $\alpha_0$ and $\beta_0$ of the interference field in the course of recording of the hologram, except measured in the medium and applying to the grating of the hologram (after shrinkage in thickness). n is the mean refractive index of the photopolymer and was set to 1.504. λ is the wavelength of the laser light in the vacuum.

The maximum diffraction efficiency (DE=$\eta_{max}$) when ξ=0, is then calculated to be:

$$DE = \tanh^2(\nu) = \tanh^2\left(\frac{\pi \cdot \Delta n \cdot d'}{\lambda \cdot \sqrt{\cos(\alpha') \cdot \cos(\alpha' - 2\psi)}}\right)$$

Figure 2:
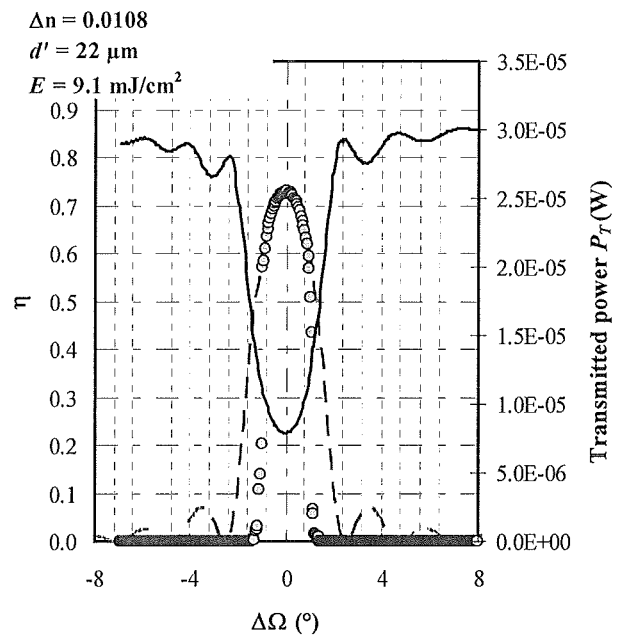
FIG. 2 shows the plot of the Bragg curve according to the coupled wave theory.

FIG. 2 shows the measured transmitted power $P_T$ (right-hand y-axis) plotted as a solid line against the angle detuning ΔΩ; the measured diffraction efficiency η (left-hand y-axis) is plotted as filled circles against angle detuning (to the extent allowed by the finite size of the detector), and the fitting to the Kogelnik theory as a broken line (left-hand y-axis).

The measured data for the diffraction efficiency, the theoretical Bragg curve and the transmitted intensity are, as shown in FIG. 2, plotted against the centered angle of rotation $\Delta\Omega = \Omega_{reconstruction} - \Omega = \alpha'_0 - \theta'_0$, also called angle detuning.

Since DE is known, the shape of the theoretical Bragg curve, according to Kogelnik, is determined only by the thickness d' of the photopolymer layer. Δn is corrected via DE for a given thickness d' such that measurement and theory for DE are always in agreement. d' is adjusted until the angle positions of the first secondary minima of the theoretical Bragg curve correspond to the angle positions of the first secondary maxima of the transmitted intensity, and there is additionally agreement in the full width at half maximum (FWHM) for the theoretical Bragg curve and for the transmitted intensity.

Since the direction in which a reflection hologram rotates when reconstructed by means of an Ω scan, but the detector for the diffracted light can detect only a finite angle range, the Bragg curve of broad holograms (small d') is not fully covered in an Ω scan, but rather only the central region, given suitable detector positioning. Therefore, the shape of the transmitted intensity which is complementary to the Bragg curve is additionally employed for adjustment of the layer thickness d'.

FIG. 2 shows the plot of the Bragg curve η according to the coupled wave theory (broken line), the measured diffraction efficiency (filled circles) and the transmitted power (black solid line) against angle detuning ΔΩ.

For a formulation, this procedure was repeated, possibly several times, for different exposure times t on different media, in order to find the mean energy dose of the incident laser beam in the course of recording of the hologram at which DE reaches the saturation value. The mean energy dose E is calculated as follows from the powers of the two component beams assigned to the angles $\alpha_0$ and $\beta_0$ (reference beam where $P_r$=0.50 mW and signal beam where $P_s$=0.63 mW), the exposure time t and the diameter of the iris aperture (0.4 cm):

$$E(mJ/cm^2) = \frac{2 \cdot [P_r + P_s] \cdot t(s)}{\pi \cdot 0.4^2 \; cm^2}$$

The powers of the component beams were adjusted such that the same power density is attained in the medium at the angles $\alpha_0$ and $\beta_0$ used.

Substances:

The alcohols and cyanuric chloride used, and also solvents and reagents, were purchased on the chemicals market.

CGI-909 Tetrabutylammonium tris(3-chloro-4-methylphenyl)(hexyl)borate, [1147315-11-4] is a product produced by CIBA Inc., Basel, Switzerland.

Desmorapid Z Dibutyltin dilaurate [77-58-7], product from Bayer MaterialScience AG, Leverkusen, Germany.

Desmodur® N 3900 Product from Bayer MaterialScience AG, Leverkusen, Germany, hexane diisocyanate-based polyisocyanate, proportion of iminooxadiazinedione at least 30%, NCO content: 23.5%.

Fomrez UL 28 Urethanization catalyst, commercial product from Momentive Performance Chemicals, Wilton, Conn., USA.

Preparation of
2,4-dichloro-6-(1-naphthyloxy)-1,3,5-triazine
[30886-30-7]

In a 2 l round-bottom flask, 125.0 g of cyanuric chloride were dissolved in 300 ml of acetone, and a solution of 96.8 g of 1-naphthol in 300 ml of acetone was slowly added dropwise at 0° C. Subsequently, 168 ml of 4 N sodium hydroxide solution were slowly added dropwise. The mixture was stirred at 0° C. for 1 h, then warmed to room temperature and stirred for a further 1 h. The aqueous phase was removed and 200 ml of 5% NaOH and 200 ml of chloroform were added to the organic phase, the aqueous phase was removed again and the organic phase was washed twice with 80 ml each time of 5% NaOH and three times with 180 ml each time of water, and dried over sodium sulfate. The mixture was filtered and the solvent was distilled off under reduced pressure. The product was obtained as a colorless solid (preparation described in WO 8704321).

Example 1

1,3,5-Triazine-2,4,6-triyl tris(oxyethane-2,1-diyl)tris acrylate [55008-80-5]

A 2 l round-bottom flask was initially charged with 218.0 g of cyanuric chloride in 0.50 l of pyridine:toluene (v:v=1:1) at 0° C., and 414 g of 2-hydroxyethyl acrylate were slowly added dropwise. Subsequently, the mixture was warmed to room temperature and stirred until the content of 2-hydroxyethyl acrylate had fallen below 0.1%. The reaction mixture was added to 1 l of ice-water and acidified with 2 N hydrochloric acid. The aqueous phase was extracted three times with 0.5 l each time of dichloromethane, and the combined organic phases were washed with 0.5 l of 10% aqueous sodium hydrogencarbonate solution and dried over sodium sulfate. The solvent was distilled off and the product was obtained as a colorless oil (preparation described in JP 56152467 A and JP 49125380).

Example 2

1,3,5-Triazine-2,4,6-triyl tris(oxybutane-4,1-diyl)tris acrylate

A 0.5 l round-bottom flask was initially charged with 55.6 g of cyanuric chloride and 127.8 g of 4-hydroxybutyl acrylate suspended in 87 ml of water at 0° C., and 210 ml of 4 N sodium hydroxide solution were slowly added dropwise. The mixture was stirred at 0° C. for 1 h and then warmed to room temperature. The reaction mixture was added to 0.3 l of water and extracted three times with 0.3 l each time of dichloromethane, and the combined organic phases were washed with 0.1 l of 1 N hydrochloric acid and twice with 0.2 l of water and dried over sodium sulfate. 0.05 g of 2,6-di-tert-butyl-4-methylphenol was added, the solvent was distilled off and the product was obtained as a colorless oil.

Example 3

1,3,5-Triazine-2,4,6-triyl tris(oxyethane-2,1-diyl)tris(2-methyl acrylate)

In a 0.5 l round-bottom flask, 34.0 g of cyanuric chloride were dissolved in 270 ml of acetone, and 86.2 g of 2-hydroxyethyl methacrylate were slowly added dropwise at 0° C. Subsequently, 138 ml of 4 N sodium hydroxide solution were slowly added dropwise. The mixture was stirred at 0° C. for 1 h and then warmed to room temperature. The aqueous phase was removed and 200 ml of 5% NaOH and 200 ml of methylene chloride were added to the aqueous phase, the aqueous phase was removed again and the organic phase was washed twice with 80 ml each time of 5% NaOH and three times with 180 ml each time of water, and dried over sodium sulfate. 0.05 g of hydroquinone (dissolved in methylene chloride) was added, the mixture was filtered and the solvent was distilled off under reduced pressure at maximum bottom temperature 45° C. The product was obtained as a colorless oil.

Example 4

Mixture of 1,3,5-triazine-2,4,6-triyl tris(oxypropane-2,1-diyl)tris acrylate and 1,3,5-triazine-2,4,6-triyl tris(oxypropane-1,2-diyl)tris acrylate In a 0.5 l round-bottom flask, 34.0 g of cyanuric chloride were dissolved in 270 ml of acetone, and 86.2 g of hydropropyl acrylate were slowly added dropwise at 0° C. Subsequently, 138 ml of 4 N sodium hydroxide solution were slowly added dropwise. The mixture was stirred at 0° C. for 1 h and then warmed to room temperature. The aqueous phase was removed and 200 ml of 5% NaOH and 200 ml of methylene chloride were added to the aqueous phase, the aqueous phase was removed again and the organic phase was washed twice with 80 ml each time of 5% NaOH and three times with 180 ml each time of water, and dried over sodium sulfate. 0.05 g of hydroquinone (dissolved in methylene chloride) was added, the mixture was filtered and the solvent was distilled off under reduced pressure at maximum bottom temperature 45° C. The product was obtained as a colorless oil.

Example 5

2-({4-[4-(Acryloyloxy)butoxy]-6-[2-(acryloyloxy) propoxy]-1,3,5-triazin-2-yl}oxy)ethyl-2-methyl acrylate (ideal structure 1:1:1 product)

In a 0.5 l round-bottom flask, 34.0 g of cyanuric chloride were dissolved in 270 ml of acetone, and a mixture of 27.8 ml of 2-hydroxyethyl methacrylate, 27.8 ml of hydroxypropyl acrylate and 30.9 ml of 4-hydroxybutyl acrylate were slowly added dropwise at 0° C. Subsequently, 138 ml of 4 N sodium hydroxide solution were slowly added dropwise. The mixture was stirred at 0° C. for 1 h and then warmed to room temperature. The aqueous phase was removed and 200 ml of 5% NaOH and 200 ml of methylene chloride were added to the aqueous phase, the aqueous phase was removed again and the organic phase was washed twice with 80 ml each time of 5% NaOH and three times with 180 ml each time of water, and dried over sodium sulfate. 0.05 g of hydroquinone (dissolved in methylene chloride) was added, the mixture was filtered and the solvent was distilled off under reduced pressure at maximum bottom temperature 45° C. The product was obtained as a colorless oil.

Example 6

[6-(1-Naphthyloxy)-1,3,5-triazine-2,4-diyl]bis(oxyethane-2,1-diyl)bisacrylate

In a 0.5 l round-bottom flask, 12.9 g of 2,4-dichloro-6-(1-naphthyloxy)-1,3,5-triazine [30886-30-7] were dissolved in 60 ml of acetone, and 10.3 ml of 2-hydroxyethyl acrylate were slowly added dropwise at 0° C. Subsequently, 22.2 ml of 4 N sodium hydroxide solution were slowly added dropwise. The mixture was stirred at 0° C. for 1 h and then warmed to room temperature. The aqueous phase was removed and 50 ml of 5% NaOH and 50 ml of chloroform were added to the organic phase, the aqueous phase was removed again and the organic phase was washed twice with 20 ml each time of 5% NaOH and three times with 50 ml each time of water, and dried over sodium sulfate. 0.005 g of hydroquinone (dissolved in acetone) was added, the mixture was filtered and the solvent was distilled off at maximum bottom temperature 45° C. under reduced pressure. The product was obtained as colorless oil.

Examples 7-11 were prepared analogously to example 6 from the raw materials specified in table 1.

Comparative example 1

2-[(Phenylcarbamoyl)oxy]ethyl prop-2-enoate [ ]

A 500 ml round-bottom flask was initially charged with 0.25 g of 2,6-di-tert-butyl-4-methylphenol, 0.12 g of Desmorapid Z and 126.4 g of phenyl isocyanate, and the mixture was heated to 60° C. Subsequently, 123.3 g of 2-hydroxyethyl acrylate were added dropwise and the mixture was kept at 60° C. until the isocyanate content had fallen below 0.1%. This was followed by cooling. The product was obtained as a crystalline solid (preparation described in DE 2329142). The product has a melting point of 66-68° C. (Bowman, Macromolecules, 2004, 37 (11), 4062-4069).

TABLE 1

Overview of triazine-based writing monomers and the comparative example

| Example | Name | $R^1$ | $R^2$ | $R^3$ | n (Method) | µ (25° C.) [mPas] | Description |
|---|---|---|---|---|---|---|---|
| 1 | 1,3,5-Triazine-2,4,6-triyl tris-(oxyethane-2,1-diyl)tris acrylate | 2-Hydroxyethyl acrylate | 2-Hydroxyethyl acrylate | 2-Hydroxyethyl acrylate | 1.598 (A) | — | Colorless oil |
| 2 | 1,3,5-Triazine-2,4,6-triyl tris(oxybutane-4,1-diyl)tris acrylate | 4-Hydroxybutyl acrylate | 4-Hydroxybutyl acrylate | 4-Hydroxybutyl acrylate | — | — | Colorless oil |
| 3 | 1,3,5-Triazine-2,4,6-triyl tris(oxyethane-2,1-diyl) tris(2-methyl acrylate) | 2-Hydroxyethyl methacrylate | 2-Hydroxyethyl methacrylate | 2-Hydroxyethyl methacrylate | 1.500 (B) | — | Colorless oil |
| 4 | Mixture of 1,3,5-triazine-2,4,6-triyl tris(oxypropane-2,1-diyl)tris acrylate and 1,3,5-triazine-2,4,6-triyl tris(oxypropane-1,2-diyl)tris acrylate | Hydroxypropyl acrylate | Hydroxypropyl acrylate | Hydroxypropyl acrylate | 1.500 (B) | 13600 | Colorless oil |
| 5 | 2-({4-[4-(Acryloyloxy)butoxy]-6-[2-(acryloyloxy)propoxy]-1,3,5-triazin-2-yl}oxy)ethyl-2- | 2-Hydroxyethyl methacrylate | Hydroxypropyl acrylate | 4-Hydroxybutyl acrylate | 1.503 (B) | 895 | Colorless oil |

TABLE 1-continued

Overview of triazine-based writing monomers and the comparative example

| Example | Name | R¹ | R² | R³ | n (Method) | μ (25° C.) [mPas] | Description |
|---|---|---|---|---|---|---|---|
| 6 | methyl acrylate (ideal structure 1:1:1 product) [6-(1-Naphthyloxy)-1,3,5-triazine-2,4-diyl] bis(oxyethane-2,1-diyl)bisacrylate | 1-Naphthol | 2-Hydroxyethyl acrylate | 2-Hydroxyethyl acrylate | 1.530 (B) | — | Colorless oil |
| 7 | [6-(1-Naphthyloxy)-1,3,5-triazine-2,4-diyl] bis(oxyethane-2,1-diyl)bis(2-methyl acrylate) | 1-Naphthol | 2-Hydroxyethyl methacrylate | 2-Hydroxyethyl methacrylate | 1.580 (B) | 24570 | Colorless oil |
| 8 | 2-({4-[2-(Acryloyloxy)-ethoxy]-6-(1-naphthyloxy)-1,3,5-triazin-2-yl}oxy)ethyl-2-methyl acrylate | 1-Naphthol | 2-Hydroxyethyl acrylate | 2-Hydroxyethyl methacrylate | 1.583 (B) | — | Colorless oil |
| 9 | 2-({4-[4-(Acryloyloxy)-butoxy]-6-(1-naphthyloxy)-1,3,5-triazin-2-yl}oxy)ethyl 2-methyl acrylate | 1-Naphthol | 4-Hydroxybutyl acrylate | 2-Hydroxyethyl methacrylate | 1.569 (B) | — | Colorless oil |
| 10 | 2-({4-[4-(Acryloyloxy)-butoxy]-6-(1-naphthyloxy)-1,3,5-triazin-2-yl}oxy)ethyl acrylate | 1-Naphthol | 2-Hydroxyethyl acrylate | 4-Hydroxybutyl acrylate | — | — | Colorless oil |
| 11 | [6-(1-Naphthyloxy)-1,3,5-triazin-2,4-diyl] bis(oxybutane-4,1-diyl)bisacrylate | 1-Naphthol | 4-Hydroxybutyl acrylate | 4-Hydroxybutyl acrylate | 1.560 (B) | — | Colorless oil |
| Comparative example 1 | 2-[(Phenylcarbamoyl)oxy]-ethyl prop-2-enoate | — | — | — | 1.591 (A) | — | Colorless solid |

To examine the optical properties, media were produced and analyzed optically as described hereinafter:

Preparation of the Polyol Component

A 1 l flask was initially charged with 0.18 g of tin octoate, 374.8 g of ε-caprolactone and 374.8 g of a difunctional polytetrahydrofuran polyether polyol (equivalent weight 500 g/mol of OH), and the mixture was heated to 120° C. and held at this temperature until the solids content (proportion of nonvolatile constituents) was 99.5% by weight or higher. Subsequently, the mixture was cooled and the product was obtained as a waxy solid.

Preparation of Urethane Acrylate 1: 2-({[3-(methylsulfanyl)phenyl]carbamoyl}oxy)-ethyl prop-2-enoate A 100 ml round-bottom flask was initially charged and initially charged with 0.02 g of 2,6-di-tert-butyl-4-methylphenol, 0.01 g of Desmorapid Z, 11.7 g of 3-(methylthio)phenyl isocyanate, and the mixture was heated to 60° C. Subsequently, 8.2 g of 2-hydroxyethyl acrylate were added dropwise and the mixture was held at 60° C. until the isocyanate content had fallen below 0.1%. This was followed by cooling. The product was obtained as a colorless liquid.

Preparation of Fluorinated Urethane 1: 2,2,3,3,4,4,5,5,6,6,7,7,8,8,9,9-hexadecafluorononyl butyl carbamate A 1 l round-bottom flask was initially charged with 0.50 g of Desmorapid Z and 186 g of n-butyl isocyanate, and the mixture was heated to 60° C. Subsequently, 813 g of 2,2,3,3,4,4,5,5,6,6,7,7,8,8,9,9-hexadecafluorononanol were added dropwise and the mixture was held at 60° C. until the isocyanate content had fallen below 0.1%. This was followed by cooling. The product was obtained as a colorless oil.

Preparation of the Media

Medium 1 (Formulation 1):

5.927 g of the polyol component prepared as described above were mixed with 2.50 g of acrylate from example 1, 0.10 g of CGI 909 and 0.010 g of new methylene blue at 60° C. and 0.35 g of N-ethylpyrilidone, so as to obtain a clear solution. Subsequently, the mixture was cooled to 30° C., 1.098 g of Desmodur® N 3900 were added and the mixture was mixed again. Finally, 0.006 g of Fomrez UL 28 was added and the mixture was mixed briefly again. The liquid material obtained was then applied to a glass plate and covered there with a second glass plate, which was kept at a distance of 20 μm by spacers. This specimen was left to stand at room temperature for 12 h and cured.

Media 2-5:

Media 2-5 were prepared in an analogous manner from the examples listed in table 2.

Medium 6 (Formulation 2):

3.40 g of the polyol component prepared as described above were mixed with 2.00 g of 1,3,5-triazine-2,4,6-triyl tris(oxyethane-2,1-diyl)tris acrylate (example 1), 2.00 g of 2-({[3-(methylsulfanyl)phenyl]carbamoyl}oxy)propyl prop-2-enoate (urethane acrylate 1), 1.50 g of 2,2,3,3,4,4,5,5,6,6,7,7,8,8,9,9-hexadecafluorononyl butyl carbamate (fluorinated urethane 1), 0.10 g of CGI 909, 0.01 g of new methyleneblue and 0.35 g of N-ethylpyrrolidone at 60° C., so as to obtain a clear solution. Subsequently, the mixture was cooled to 30° C., 0.63 g of Desmodur N3900 was added and the mixture was mixed again. Finally, 0.006 g of Fomrez UL 28 was added and the mixture was mixed briefly again. The liquid material obtained was then applied to a glass plate and covered there with a second glass plate, which was kept at a distance of 20 μm by spacers. This specimen was left to stand at room temperature for 12 hours and cured.

Media 7-11:
Media 7-11 were prepared in an analogous manner from the examples listed in table 3.

Comparative Medium 1:
5.927 g of the polyol component prepared as described above were mixed with 2.50 g of 2-[(phenylcarbamoyl)oxy] ethyl prop-2-enoate (comparative example 1), 0.10 g of CGI 909 and 0.010 g of new methyleneblue at 60° C. and 0.35 g of N-ethylpyrilidone were mixed, so as to obtain a clear solution. Subsequently, the mixture was cooled to 30° C., 1.098 g of Desmodur® N 3900 were added and the mixture was mixed again. Finally, 0.006 g of Fomrez UL 28 was added and the mixture was mixed briefly again. The liquid material obtained was then applied to a glass plate and covered there with a second glass plate, which was kept at a distance of 20 μm by spacers. This specimen was left to stand at room temperature for 12 h and cured.

Holographic Testing:
The media produced as described were subsequently tested for their holographic properties in the manner described above by means of a test arrangement according to FIG. 1. The following values were found for $\Delta n_{sat}$ at the dose E [mJ/cm$^2$]:

TABLE 2

Holographic assessment of selected examples in formulation 1

| Medium | Example | $\Delta n_{sat}$ | Dose E [mJ/cm$^2$] |
|---|---|---|---|
| 1 | 1 | 0.0099 | 18 |
| 2 | 2 | 0.0081 | 18 |
| 3 | 4 | 0.0058 | 18 |
| 4 | 5 | 0.0056 | 18 |
| 5 | 6 | 0.0066 | 9 |
| Comparative medium 1 | Comparative example 1 | 0.0044 | 73 |

TABLE 3

Holographic assessment of selected examples in formulation 2

| Medium | Example | $\Delta n_{sat}$ | Dose E [mJ/cm$^2$] |
|---|---|---|---|
| 6 | 1 | 0.0253 | 18 |
| 7 | 2 | 0.0219 | 18 |
| 8 | 3 | 0.0175 | 18 |
| 9 | 4 | 0.0258 | 9 |
| 10 | 5 | 0.0199 | 18 |
| 11 | 6 | 0.0192 | 4 |

The values found for $\Delta n_{sat}$ show that the urethane acrylate used in the comparative medium is less suitable for use in holographic media, whereas the acrylates in media 1 to 5 and 6 to 11 are very suitable for the production of holographic media on the basis of the higher value for $\Delta n_{sat}$. In addition, the acrylates described are notable in relative terms for a lower viscosity, which distinctly improves transportability and processability in a resulting photopolymer formulation, whereas the comparative example only melts well above room temperature and is therefore more difficult to process.

The invention claimed is:

1. A photopolymer formulation comprising polyurethane matrix polymers, writing monomers and photoinitiators, wherein the writing monomers comprise compounds of the formula (I)

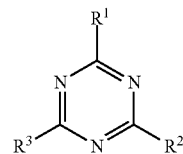

(I)

wherein
R$^1$, R$^2$, R$^3$ are each independently OH, halogen or an organic radical, where at least one of the radicals is an organic radical having a radiation-curing group, wherein the organic radical(s) is/are bonded to the triazine ring via an oxygen atom, wherein the photopolymer formulation additionally comprises a urethane as plasticizers, where the urethane is substituted by at least one fluorine atom, and wherein the writing monomer is a colorless liquid and wherein the polyurethane matrix polymers are not substituted by fluorine.

2. The photopolymer formulation of claim 1, wherein the radiation-curing group is an acrylate or methacrylate group.

3. The photopolymer formulation of claim 1, wherein R$^1$, R$^2$, R$^3$ are each independently halogen and/or substituted or unsubstituted phenoxy, naphthloxy, 2-hydroxyethyl (meth) acrylate radicals, hydroxypropyl (meth)acrylate radicals and/or 4-hydroxybutyl (meth)acrylate radicals, where at least one of the R$^1$, R$^2$, R$^3$ radicals is a 2-hydroxyethyl (meth)acrylate, hydroxypropyl (meth)acrylate or 4-hydroxybutyl (meth) acrylate radical.

4. The photopolymer formulation of claim 3, wherein at least two of the R$^1$, R$^2$, R$^3$ radicals are each independently a 2-hydroxyethyl (meth)acrylate, hydroxypropyl (meth)acrylate and/or 4-hydroxybutyl (meth)acrylate radical.

5. The photopolymer formulation of claim 1, wherein the photoinitiators comprise an anionic, cationic or uncharged dye and a coinitiator.

6. The photopolymer formulation of claim 1, wherein the urethanes have the general formula (II)

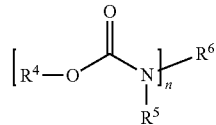

(II)

in which n≥1 and n≤8 and R$^4$, R$^5$, R$^6$ are each independently hydrogen, linear, branched, cyclic or heterocyclic organic radicals which are unsubstituted or else optionally substituted by heteroatoms, where preferably at least one of the R$^4$, R$^5$, R$^6$ radicals is substituted by at least one fluorine atom, and R$^4$ is more preferably an organic radical with at least one fluorine atom.

7. The photopolymer formulation of claim 1, wherein the writing monomers additionally comprise a further mono- or polyfunctional writing monomer, which may especially be a mono- or polyfunctional acrylate.

8. A holographic medium prepared from by recording a hologram in the photopolymer formulation of claim 1.

9. The holographic medium of claim 8, wherein said hologram is selected from the group consisting of inline holograms, off-axis holograms, full-aperture transfer holograms, white light transmission holograms, Denisyuk holograms, off-axis reflection holograms, edge-lit holograms, and holographic stereograms.

10. The photopolymer formulation of claim 1, wherein the polyurethane matrix polymer is obtained by reaction of an isocyanate component a) with an isocyanate-reactive component b), and wherein the isocyanate-reactive component b) is selected from the group consisting of polyester polyols, polyether polyols, polycarbonate polyols, poly(meth)acrylate polyols, polyurethane polyols, and aliphatic, araliphatic or cycloaliphatic di, tri or polyfunctional alcohols containing 2 to 20 carbon atoms.

* * * * *